United States Patent
Moreno Colom et al.

(10) Patent No.: US 11,054,487 B2
(45) Date of Patent: Jul. 6, 2021

(54) MULTIPLE REDUNDANCY POSITION SENSOR DEVICE

(71) Applicant: Fico Triad, S.A, Barcelona (ES)

(72) Inventors: Javier Moreno Colom, Barcelona (ES); Oscar Ferrer Ribas, Barcelona (ES)

(73) Assignee: FICO TRIAD, S.A., Barcelona (ES)

( * ) Notice: Subject to any disclaimer, the term of this patent is extended or adjusted under 35 U.S.C. 154(b) by 23 days.

(21) Appl. No.: 16/210,821

(22) Filed: Dec. 5, 2018

(65) Prior Publication Data

US 2019/0170833 A1 Jun. 6, 2019

(30) Foreign Application Priority Data

Dec. 5, 2017 (EP) .................................. 17382838

(51) Int. Cl.
*G01R 33/00* (2006.01)
*G01B 7/00* (2006.01)
(Continued)

(52) U.S. Cl.
CPC ....... *G01R 33/0023* (2013.01); *F16H 59/044* (2013.01); *G01B 7/003* (2013.01);
(Continued)

(58) Field of Classification Search
CPC ................ G01R 33/0023; G01R 33/09; G01R 33/0005; G01R 35/005; F16H 59/044; F16H 59/70; F16H 59/105; F16H 59/0204; F16H 2059/047; F16H 2059/081; F16H 2061/1208; F16H 2061/1284;
(Continued)

(56) References Cited

U.S. PATENT DOCUMENTS 4,268,100 A * 5/1981 Kekas ...................... H05K 7/16
361/725
4,296,398 A * 10/1981 McGalliard .......... H01H 85/046
337/232
(Continued)

FOREIGN PATENT DOCUMENTS

EP 2171315 A1 4/2010
JP 2004210251 A 7/2004
WO 0216879 A1 2/2002

OTHER PUBLICATIONS

Allegro Microsystems, LLC Introduces New Dual Die, Hall-Effect Angle Sensor ICs for Motor Position Applications, Allegro Microsystems—A1331, A1334 Press Release, 2015 (Year: 2015).*
(Continued)

*Primary Examiner* — Daniel R Miller
(74) *Attorney, Agent, or Firm* — Brooks Kushman P.C.

(57) ABSTRACT

The multiple redundancy position sensor device intended for detecting the position of a shifter lever in a shifter device, comprises a first magnetic sensor and a second magnetic sensor facing the first magnetic sensor, one of the sensors being a dual die magnetic sensor. A polarized magnet is arranged between the sensors such that the polarized magnet can be rotated with at least one degree of freedom. A signal based on the angular position of the polarized magnet relative to the first magnetic sensor and the second magnetic sensor corresponding to a shifter lever position is output to control a vehicle transmission.

20 Claims, 4 Drawing Sheets

(51) Int. Cl.
  H05K 1/02 (2006.01)
  G01D 5/14 (2006.01)
  F16H 59/04 (2006.01)
  G01R 33/09 (2006.01)
  F16H 59/70 (2006.01)

(52) U.S. Cl.
  CPC ......... G01D 5/145 (2013.01); G01R 33/0005 (2013.01); G01R 33/09 (2013.01); H05K 1/0213 (2013.01); F16H 59/70 (2013.01)

(58) Field of Classification Search
  CPC .... F16H 2061/243; F16H 59/08; F16H 61/12; F16H 2059/0295; F16H 59/10; F16H 2059/0239; F16H 2059/0265; F16H 2059/0273; F16H 2061/1232; F16H 59/68; F16H 61/24; F16H 2059/6807; F16H 2061/122; F16H 2061/1224; F16H 2061/1288; F16H 2061/223; F16H 2061/241; F16H 2061/242; F16H 2061/247; F16H 2061/2823; F16H 2061/283; F16H 2061/326; F16H 59/0278; F16H 61/0006; F16H 61/0403; F16H 61/28; F16H 61/2807; F16H 61/32; F16H 63/42; G01D 5/145; H05K 1/0213; G01B 7/003; G01B 7/30; Y10T 74/2003
  See application file for complete search history.

(56) References Cited

U.S. PATENT DOCUMENTS

| | | | | |
|---|---|---|---|---|
| 4,553,111 | A | * | 11/1985 | Barrow .................. H01P 3/081 333/1 |
| 4,979,074 | A | * | 12/1990 | Morley ................ H05K 3/0061 165/185 |
| 7,009,388 | B2 | * | 3/2006 | Johnson ................ G01D 5/145 324/207.24 |
| 2005/0000268 | A1 | * | 1/2005 | Kuwata ................ F16H 59/105 73/1.75 |
| 2006/0113989 | A1 | * | 6/2006 | Nicolosi ................ G01D 5/147 324/207.2 |
| 2008/0079423 | A1 | * | 4/2008 | Wolf ...................... G01D 5/145 324/207.25 |
| 2008/0094199 | A1 | | 4/2008 | Kazyaka |
| 2012/0025810 | A1 | * | 2/2012 | Uhlenbruck .......... F16H 59/044 324/207.2 |
| 2015/0323346 | A1 | * | 11/2015 | Maiterth ................ G01D 5/145 324/207.22 |

OTHER PUBLICATIONS

Extended European Search Report for Application No. 17382838.5, dated Jun. 8, 2018, 6 pages.

\* cited by examiner

FIG. 7
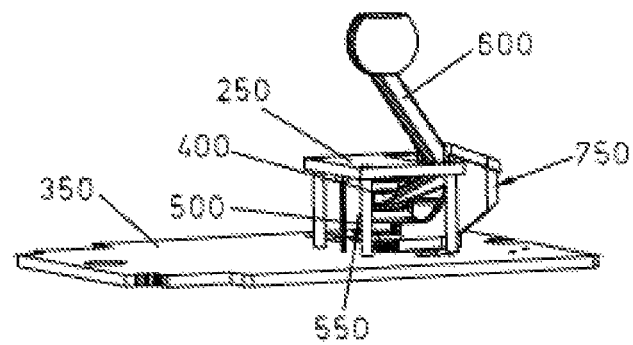
FIG. 8
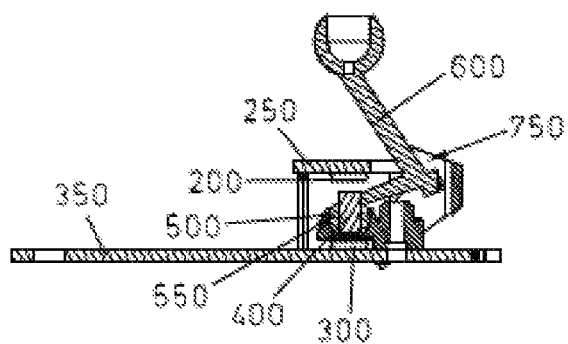
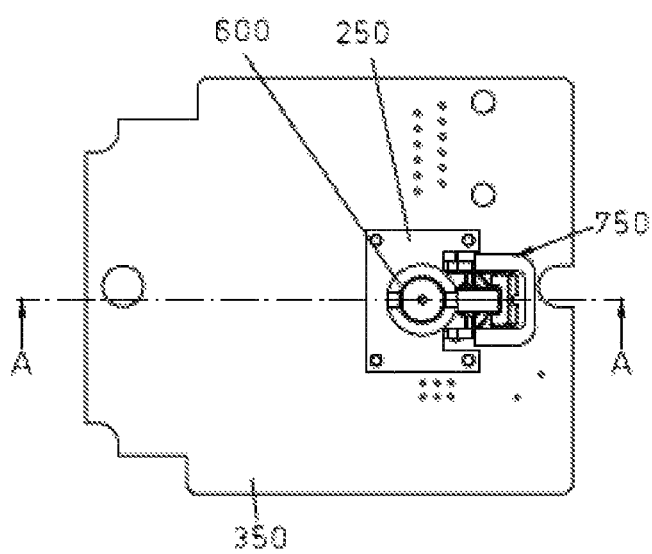
FIG. 9

MULTIPLE REDUNDANCY POSITION SENSOR DEVICE

CROSS-REFERENCE TO RELATED APPLICATIONS

This application claims priority to European patent application EP 17382838.5 filed on Dec. 5, 2017, the disclosure of which is hereby incorporated in its entirety by reference herein.

TECHNICAL FIELD

The present disclosure relates to electronic shifter devices for motor vehicles and specifically to devices for detecting the position of a shifter lever in the shifter devices to control a vehicle transmission.

BACKGROUND

Current electronic shifter devices include position sensors for detecting the position of a shifter lever based on which electric signals are output to an electronic control unit (ECU) in a motor vehicle in order to control the transmission. In known shifter devices, the signals output to the ECU are compared with predetermined values to determine if they are correct.

Examples of position sensors used in current electronic gear shifters are three-dimensional Hall-effect sensors arranged to detect the position of a magnet attached to the shifter lever in three different spatial axes. The sensors output electric signals to an ECU in a motor vehicle in order to control the transmission according to the detected shifter lever position.

In addition, redundancy in detecting the position of a shifter lever is a requirement in current gear shifters for the sake of safety. With redundancy, the position of the shifter lever as the shift lever is actuated to control a vehicle transmission can be detected even with a sensor malfunction.

Redundant position detecting devices can perform an additional determination of shifter lever positions in order to properly ensure the safety in the control of the vehicle transmission even in case of failure or malfunction of at least one position sensor. Such case of failure or malfunction of at least one position sensor may occur when two or more position sensors of a shifter lever output different signals. As a result, the gear position sensor device may provide a faulty indication of the shifter lever position. In some cases, a safety operation may be also performed in the event of a sensor failure. Safety operations may be, for example, stopping the motor vehicle, setting the gear shifter into a determined safety gear shift position, etc. A warning signal may be also generated alone or combined with a safety operation so as to bring the malfunction to the attention of the driver of the vehicle.

Redundancy is provided through the use of multiple magnetic sensors which are typically arranged on a same plane and one next to the other. In such cases, to ensure that all sensors detect a shifter lever position, the magnet must be of a large size or multiple magnets must be used. Otherwise, the magnet would not be properly detected by all magnetic sensors and their signals would not be reliable. The higher the redundancy level, the larger the number of magnetic sensors required and, consequently, the larger the magnet or the number of magnets required. The use of multiple parts such as sensors, magneto resistive elements, etc., to provide multiple redundancy renders the assembly bulky with undesirable heavy weight and complexity resulting in high costs in known position sensor devices which also take up much space requiring large installation spaces.

US2016265895 discloses a sensor arrangement comprising a number of first and second magneto resistive elements. The magneto resistive elements comprise a stack of ferromagnetic and non-magnetic layers arranged linearly on a substrate. A permanent magnet is arranged between the first and second magneto resistive elements. The permanent magnet can be displaced along a longitudinal axis such that a position of the magnetic field source along a longitudinal axis can be derived.

Multi-layered magneto resistive elements still render the assembly undesirably complex and expensive. In addition, it has been found with the above configuration that the magnetic field detected by the magneto resistive elements is drastically reduced depending on the distance between the magnet and the magneto resistive elements.

A need therefore exists for a shifter lever position sensor device with which the position of the shifter lever can be accurately and precisely detected while costs are reduced.

SUMMARY

The object of the present position sensor device is to enhance safety in controlling a vehicle transmission. This is achieved by providing multiple redundancy, such as dual, triple redundancy or even higher together with high accuracy in determining the position of a shifter lever in a motor vehicle shifter device. As a result of the advantageous configuration of the present position sensor device, the above objects are obtained with a minimum number of parts as a result of which complexity and thus costs are advantageously reduced.

The present multiple redundancy position sensor device may be part of a detection module in a motor vehicle shifter device for detecting the position of a shifter lever for the purpose of outputting electric signals to an electronic control unit (ECU) in a motor vehicle in order to control the transmission according to the detected shifter lever position.

The present sensor device comprises a first magnetic sensor and a second magnetic sensor. Both magnetic sensors are arranged facing each other. A first geometric axis is defined by the first and second magnetic sensors. Such first geometric axis may be, for example, defined by a line perpendicular to both magnetic sensors.

One magnetic sensor is a dual die magnetic sensor. Embodiments where both magnetic sensors are dual die magnetic sensors are of course possible. In one preferred example, the first magnetic sensor is a single die magnetic sensor and the second magnetic sensor is a dual die magnetic sensor. This arrangement provides triple redundancy.

The dual die magnetic sensor comprises first and second sensor dice, also referred to as silicon wafers, or silicon dice, integrated in a single small package separated from each other. The sensor dice are configured to operate independent from each other in order to provide redundancy.

A polarized magnet is arranged between the first magnetic sensor and the second magnetic sensor. The polarized magnet is arranged between the magnetic sensors such that the polarized magnet can be rotated, with at least one degree of freedom. For example, the polarized magnet may be arranged such that the polarized magnet can be rotated around a second geometric axis. The second geometric axis may be, for example, a longitudinal geometric axis of the polarized magnet. A polarized magnet may be alternatively arranged to be rotated around an inclined axis on a point in the magnet itself.

Both magnetic sensors are configured to detect the rotational movement of the polarized magnet, for example the movement of the polarized magnet at three spatial axes, for example, when the sensors are of the three-dimensional type. As a result, one signal for each sensor die based on the angular position of the polarized magnet relative to the first and second magnetic sensors corresponding to a shifter lever position can be output to an ECU to control a vehicle transmission. The signals are then compared with each other by the ECU so as to obtain the shifter lever position.

In one example of the present sensor device, the first geometric axis and the second geometric axis are coincident or parallel to each other. However, in another different example, the first geometric axis and the second geometric axis are perpendicular to each other. Other different relative arrangements of the first geometric axis and the second geometric axis are not ruled out.

It may be envisaged that, in use, a rotational movement of the polarized magnet between the first and second magnetic sensors is further combined by a deviation of the second geometric axis relative to the first geometric axis. Other different rotations of the polarized magnet between the first and second magnetic sensors are not ruled out such as, for example, rotation around a point.

A magnet support may be also provided for the purpose of supporting the polarized magnet. One example of magnet support may be a ball joint that may, for example, comprise a ball member adapted for receiving the polarized magnet therein. It may be preferred that the ball member is configured such that the polarized magnet is fitted therein in a way that the polarized magnet does not move relative to the ball member. The ball member is thus configured to rotate the polarized magnet relative to the first and second magnetic sensors as the ball member is driven for example when a shifter lever is actuated by the user. As a result, the polarized magnet is allowed to move according to two degrees or freedom or three degrees or freedom. It is to be noted that joints other than ball joints may be alternatively used for receiving therein the polarized magnet, such as, for example, cylinder shaped joints.

In one preferred example, the polarized magnet has two opposite faces. Each face of the polarized magnet includes at least one north pole and at least one south pole therein. This is the case of radial polarized magnets.

In another preferred example, one face of the polarized magnet includes a single north pole therein and the other face includes a single south pole therein. This is the case of longitudinal polarized magnets.

Although the first and second magnetic sensors may be two-dimensional magnetic sensors, it is preferred that the first and second magnetic sensors are three-dimensional magnetic sensors.

Two printed circuit boards (PCB) may be provided. Specifically, the first magnetic sensor may be connected to a first PCB and the second magnetic sensor may be connected to a second PCB. Both PCBs may be electrically connected to each other, e.g., through a suitable electrical connector, although this is not required. Connection between the first and second PCBs is not indispensable. The point is that sensor signals arrive the ECU to determine a magnet position.

A separation distance is defined between the center of the polarized magnet and the first printed circuit board. A separation distance is also defined between the center of the polarized magnet and the second printed circuit board. It may be advantageous that the separation distances remain constant as the polarized magnet rotates, for example, when driven when a shifter lever is actuated by the user.

The sensor device that has been described above provides increased reliability with true redundancy. This is carried out by a sensor device whose complexity and therefore costs are reduced due to greater simplicity since only a single polarized magnet is required. Overall size is also advantageously reduced due to the provision of dual die magnetic sensor which results in a reduced size as compared to the provision of two single die sensors assembled in parallel. Also, when the first magnetic sensor is a single die magnetic sensor and the second magnetic sensor is a dual die magnetic sensor, the printed circuit board associated with the first magnetic sensor is small in size.

A shifter device is also described herein. The present shifter device comprises a shifter lever movable for controlling a vehicle transmission and the multiple redundancy position sensor device as described above for detecting the position of the shifter lever for the purpose of outputting electric signals to an electronic control unit (ECU) in a motor vehicle in order to control the transmission according to the detected shifter lever position.

In the present shifter device, the polarized magnet is arranged between the first and second magnetic sensors, as described above, such that the magnet can be rotated with at least one degree of freedom as the shifter lever is actuated by the user. As a result of the rotational movement of the polarized magnet, a more reliable signal based on its angular position relative to the first and second magnetic sensors is output to control a vehicle transmission due to the fact that at least three different signals are compared.

The present shifter device may further include the above described ball joint for receiving therein the polarized magnet. The ball joint is configured to rotate the polarized magnet relative to the first and second magnetic sensors as the shifter lever is actuated. Other joints different from ball joints may be alternatively used for receiving therein the polarized magnet.

The present shifter device may be configured such the shifter lever has one degree of freedom or two degrees of freedom. A connecting lever is further provided for mechanically connecting the shifter lever to the magnet support joint where the polarized magnet is received.

A restraining mechanism may be further provided. The restraining mechanism is preferably formed in the shifter lever. However, the restraining mechanism could be formed in the connecting lever or alternatively in the shifter lever and in the connecting lever. The restraining mechanism is configured to lock the shifter lever from being rotated about itself as it is actuated. The restraining mechanism may be formed of a ring shaped to restrain rotation of the shifter lever from being rotated about itself.

One advantage of the present position sensor device is that only a single magnet is required to obtain multiple redundancy such as for example triple redundancy. Depending on the type of sensors, higher level of redundancy can be obtained. For example, if the first magnetic sensor is a single die magnetic sensor and the second magnetic sensor is a dual die magnetic sensor, triple redundancy is provided, as disclosed above. If both the first magnetic sensor and the second magnetic sensor are dual die magnetic sensors, quadruple redundancy is provided. Robustness can be thus easily increased as required with no need of additional magnets and sensors to detect the shifter lever position.

A further advantage is that at least three different signals output to the ECU are compared in the multiple redundancy position sensor device with predetermined values to determine if they are correct.

Additional objects, advantages and features of examples of the present multiple redundancy position sensor device will become apparent to those skilled in the art upon examination of the description, or may be learned by practice thereof.

BRIEF DESCRIPTION OF THE DRAWINGS

Particular embodiments of the present multiple redundancy position sensor device will be described in the following by way of non-limiting examples, with reference to the appended drawings, in which:

FIG. 7 is a perspective view of still a further example of a position sensor device in a shifter lever with two degrees of freedom to transmit movement to polarized magnet;

FIG. 8 is a sectional view of another of the shifter lever shown in FIG. 7 taken along line AA in FIG. 9;

FIG. 9 is a top plan view of the shifter lever shown in FIG. 7; and

DETAILED DESCRIPTION

Figure 1:
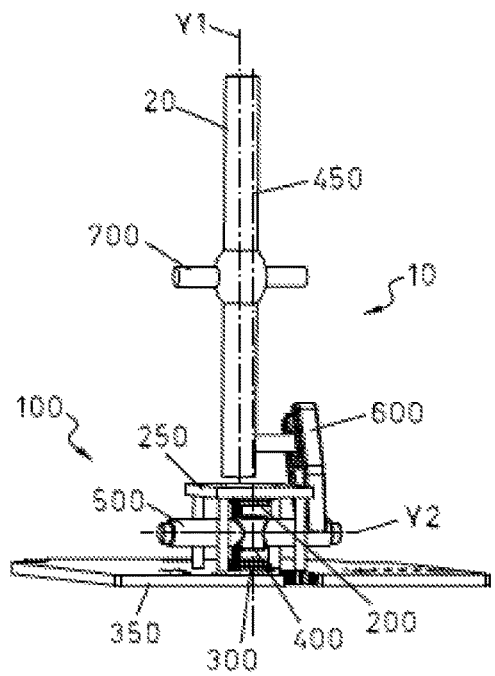
FIG. 1 is a perspective view of one example of a position sensor device in a shifter lever with one degree of freedom to transmit movement to polarized magnet.

Three advantageous examples of the present position sensor device 100 are given below and illustrated in the drawings that illustrate a motor vehicle shifter device 10 where the position sensor device 100 is fitted.

The shifter device shown in the drawings comprises a shifter lever 20 movably mounted in a housing. The shifter lever 20 may be actuated by the user for controlling a vehicle transmission. The shifter device 10 further includes a multiple redundancy position sensor device 100 for detecting the position of the shifter lever 20 as it is actuated. An electronic control unit (ECU), not shown, is input with electric signals according to the detected position of the shifter lever 20 so as to control the transmission.

The single die magnetic sensor 200 is formed of a single sensor die. The dual die magnetic sensor 300 is formed of a two sensor die integrated in a single package, separated from each other so as to operate independent from each other to provide dual redundancy. As a result, the combination of the magnetic sensors 200, 300 provides triple redundancy in detecting the position of the shifter lever 20 to properly ensure the safety in the control of the vehicle transmission even in case of failure or malfunction of at least one of the sensor dice which may occur when signals corresponding to a position of shifter lever 20 provided by the three sensor dice are different.

A polarized magnet 400 is arranged between the first and second magnetic sensors 200, 300. The polarized magnet 400 is arranged such that the polarized magnet 400 can be rotated as the shifter lever 20 is actuated by the user for controlling the vehicle transmission.

With the above described configuration, three signals based on the angular position of the polarized magnet 400 relative to the three sensor dice, and corresponding to a position of the shifter lever 20, can be output to an ECU to control a vehicle transmission. Values from at least three signals are then compared by the ECU with each other to detect the position of the shifter lever 20.

Figure 4:
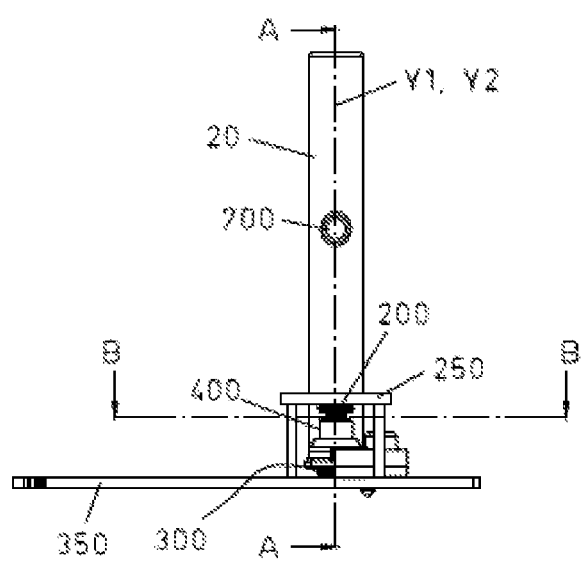
FIG. 4 is an elevational view of another example of a position sensor device in a shifter lever with one degree of freedom to transmit movement to polarized magnet.
Figure 5:
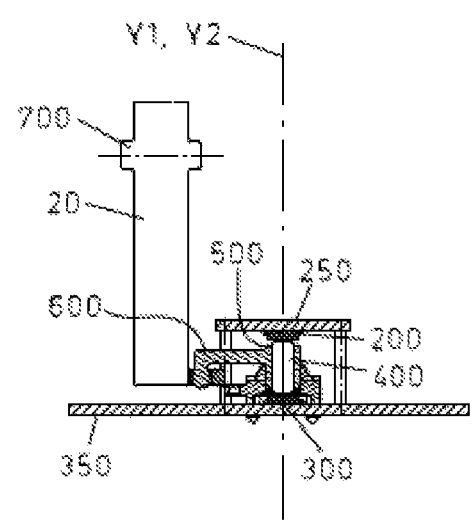
FIG. 5 is a sectional view of the shifter lever shown in FIG. 4 taken along line AA in FIG. 4.
Figure 6:
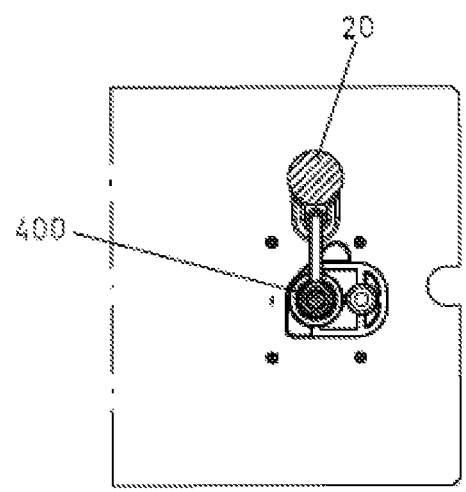
FIG. 6 is a top plan view of the shifter lever shown in FIG. 4 taken along line BB in FIG. 4.

A line perpendicular to the first and second magnetic sensors 200, 300 defines a first geometric axis Y1. The line around which polarized magnet 400 can be rotated defines a second geometric axis Y2. In the example shown in FIGS. 4, 5 and 6, the polarized magnet 400 is of the radial type, with north and south poles in the same face. As shown in FIGS. 4, 5, and 6; the second geometric axis Y2 corresponds to a longitudinal geometric axis 450 of the polarized magnet 400. In the example shown in FIGS. 1, 2, and 3; the polarized magnet 400 is of the longitudinal type, with a north pole in one face and a south pole in an opposite face. The second geometric axis Y2 is perpendicular to the longitudinal geometric axis 450 of the polarized magnet 400. In the example of the present sensor device 100 shown in FIGS. 4-6, the first geometric axis Y1 and the second geometric axis Y2 are coincident to each other. In example of the present sensor device 100 shown in FIGS. 1-3, the first geometric axis Y1 and the second geometric axis Y2 are perpendicular to each other. In FIGS. 7-9, no longitudinal geometric is defined.

In use, a rotational movement of the polarized magnet 400 between the first and second magnetic sensors 200, 300 may be further allowed so as to detect a movement with two degrees of freedom.

Figure 2:
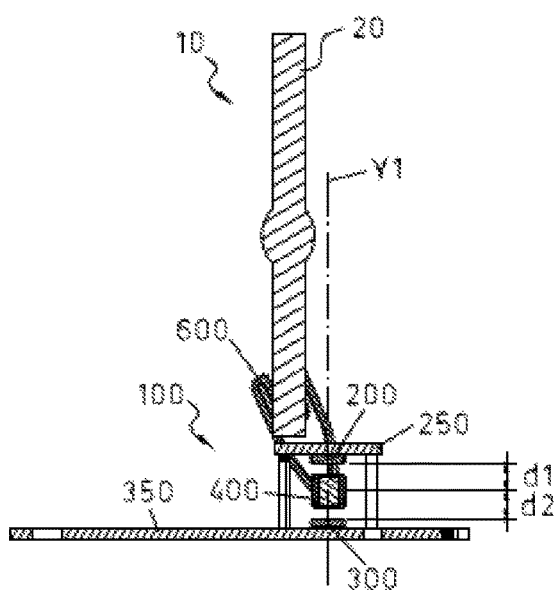
FIG. 2 is a sectional view taken along line AA in FIG. 3 of the shifter lever shown in FIG. 1.
Figure 3:
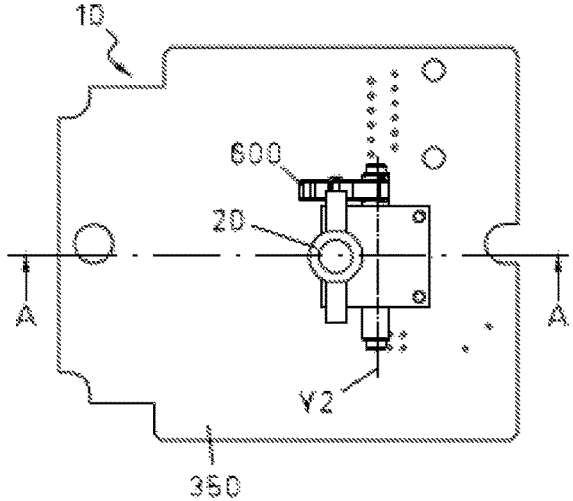
FIG. 3 is a top plan view of the shifter lever shown in FIG. 1.

In the example shown in FIGS. 1-3 and in FIGS. 7-10, a polarized magnet 400 of the longitudinal type is provided, that is, with a north pole in one face and a south pole in an opposite face. The sensor device 100 in this case includes three-dimensional magnetic sensors 200, 300 capable of detecting movements of 2 degrees of freedom and thus suitable to detect rotations of the longitudinal polarized magnet 400 around the horizontal axis of rotation Y2.

In the example shown in FIGS. 4-6, a polarized magnet 400 of the radial type is provided, that is, with north and south poles in the same face. The sensor device 100 in this case includes two-dimensional magnetic sensors 200, 300 capable of detecting movements of 1 degree of freedom and thus suitable to detect rotations of the radial polarized magnet 400 around the vertical axis of rotation Y1.

As shown in FIG. 8, a ball joint 500 is provided. The ball joint 500 comprises a ball member 550 adapted for receiving therein a polarized magnet 400 of the longitudinal type, with a north pole in one face and a south pole in an opposite face. The longitudinal polarized magnet 400 is received into the ball member 550 such that they do not move relative each other when in use. Thus, the ball member 550 is configured to move the polarized magnet 400 relative to the first and second magnetic sensors 200, 300 as the ball member 550 is actuated.

Two printed circuit boards (PCBs) 250, 350 are also provided. Specifically, the first magnetic sensor 200 is connected to a first PCB 250 and the second magnetic sensor 300 is connected to a second PCB 350. Both PCBs are electrically connected to each other through a connector. As it can be seen, the PCB 250 that is associated with the single die magnetic sensor 200 is smaller in size that the PCB 350 that is associated with the dual die magnetic sensor 300.

A first distance d1 is defined between the center of the polarized magnet 400 and the first magnetic sensor 200. A second distance d2 is defined between the center of the polarized magnet 400 and the second magnetic sensor 300. Both distances d1, d2 remain constant, i.e., they are not varied, as the polarized magnet 400 rotates when driven when a shifter lever 20 is actuated by the user. A gap always exists between the first and second magnetic sensors, 200, 300 and the polarized magnet 400.

Figure 10:
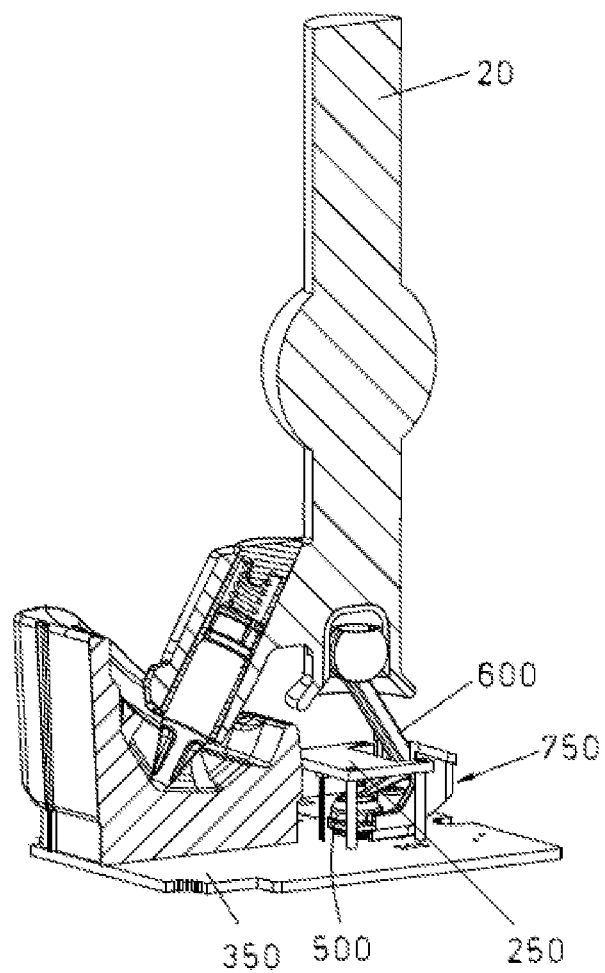
FIG. 10 is a perspective sectional view of the shifter lever showing the connecting lever in more detail.

In order to lock the shifter lever 20 from being rotated about itself, the shift lever 20 is actuated by the user, a restraining mechanism is provided. The restraining mechanism, as shown in detail in FIG. 10, is configured to restrain rotation of the shifter lever 20 or the connecting lever 600 or both, about itself when in use. At least two examples of restraining mechanisms may be devised. In a first example, shown in FIGS. 1-5, the restraining mechanism 700 is associated with the shifter lever 20. In a second example, shown in FIG. 8, the restraining mechanism 750 is associated with a connecting lever 600 that mechanically connects the shifter lever 20 to the ball joint 500 as will be described below.

The shifter lever 20 in the present shifter device 10 may be configured to have one degree of freedom as shown in FIGS. 1-6 of the drawings or two degrees of freedom, as shown in FIGS. 7-10 of the drawings.

As stated above, the shifter device 10 may be configured such that the shifter lever 20 has one degree of freedom or two degrees of freedom to transmit the rotation to the polarized magnet 400.

In a shifter lever 20 with two degrees of freedom as shown in FIG. 7, a connecting lever 600 is provided that mechanically connects the shifter lever 20 to the ball joint 550 to which the polarized magnet 400 is attached.

In a shifter lever 20 with one degree of freedom, the connecting lever 600 may not be required and the shifter device 10 can be simplified. A shifter lever 20 with one degree of freedom may still include the connecting lever 600 with a fixed axis around which it can be rotated when the shifter lever 20 is actuated.

In any of the examples described above, the multiple redundancy position sensor device 100 provides higher robustness, increased reliability and true redundancy when detecting the position of the shifter lever 20 in a motor vehicle shifter device 10 with high accuracy. This is achieved with greater simplicity due to the reduced number of parts since only a single polarized magnet 400 is required. Also, since the polarized magnet 400 only performs a rotational movement, a compact system with reduced dimensions is achieved as compared to prior art detecting devices with multiple single die sensors assembled in parallel that performs a linear movement. As a result, costs are advantageously reduced, while also enhancing safety in controlling a vehicle transmission.

Although only a number of particular embodiments and examples of the present multiple redundancy position sensor device have been disclosed herein, it will be understood by those skilled in the art that other alternative examples and/or uses and obvious modifications and equivalents thereof are possible. For example, although the use of Hall sensor elements is preferred as they are capable of measuring almost the same magnetic field and thus ensuring synchronous output signals, other different sensor elements may be use.

Furthermore, the present disclosure covers all possible combinations of the particular examples described.

Reference signs related to drawings and placed in parentheses in a claim, are solely for attempting to increase the intelligibility of the claim, and shall not be construed as limiting the scope of the claim.

Thus, the scope of the present disclosure should not be limited by particular examples but should be determined only by a fair reading of the claims that follow.

What is claimed is:

1. A multiple redundancy position sensor device for detecting a position of a shifter lever in a shifter device, the sensor device comprising:
a first magnetic sensor positioned on a first printed circuit board;
a second magnetic sensor facing the first magnetic sensor and being positioned on a second printed circuit board below the first magnetic sensor and the first printed circuit board, with at least one of the first and second magnetic sensor being a dual die magnetic sensor, wherein the first printed circuit board and the second printed circuit board extend horizontally along a first axis and are parallel to another, and wherein a first geometric axis extends through the first magnetic sensor and the second magnetic sensor and is perpendicular to the first axis; and
a polarized magnet arranged between the first magnetic sensor and the second magnetic sensor such that the polarized magnet is rotatable with at least one degree of freedom, wherein a signal based on an angular position of the polarized magnet relative to the first magnetic sensor and the second magnetic sensor corresponding to a shifter lever position is output to control a vehicle transmission.

2. The sensor device of claim 1, wherein the polarized magnet is arranged such that the polarized magnet is rotated around a second geometric axis.

3. The sensor device of claim 2, wherein the first geometric axis and the second geometric axis are coincident or parallel to each other.

4. The sensor device of claim 2, wherein the polarized magnet is configured to be rotatable with two degrees of freedom such that the second geometric axis is moveable relative to the first geometric axis.

5. The sensor device of claim 2, wherein the first geometric axis and the second geometric axis are perpendicular to each other.

6. The sensor device of claim 1 further comprising a magnet support for receiving the polarized magnet therein and being configured to move the polarized magnet relative to the first magnet sensor and the second magnetic sensor as the magnet support is actuated.

7. The sensor device of claim 1, wherein the polarized magnet has two opposite faces with each face including at least one north pole and at least one south pole therein, or one face of the polarized magnet includes a single north pole therein and the other face includes a single south pole therein.

8. The sensor device of claim 1, wherein the first magnetic sensor and the second magnetic sensor are one of two-dimensional magnetic sensors or three-dimensional magnetic sensors.

9. The sensor device of claim 1, wherein the first printed circuit board and the second printed circuit board are electrically connected to one another.

10. The sensor device of claim 9, wherein the polarized magnet is arranged such that a separation distance between the polarized magnet and the first printed circuit board and a separation distance between the polarized magnet and the second printed circuit board remains constant as the polarized magnet moves.

11. The sensor device of claim 1, wherein the first magnetic sensor is a single die magnetic sensor and the second magnetic sensor is a dual die magnetic sensor.

12. A shifter device comprising a shifter lever movable for controlling a vehicle transmission and a multiple redundancy position sensor device according to claim 1 for detecting the position of the shifter lever, wherein the polarized magnet is arranged between the first magnetic sensor and the second magnetic sensor such that the polarized magnet is rotatable with the at least one degree of freedom as the shifter lever is actuated by a user whereby the signal based on the angular position of the polarized magnet relative to the first magnetic sensor and the second magnetic sensor is output to control the vehicle transmission.

13. The shifter device of claim 12 further comprising a magnet support for receiving the polarized magnet therein and configured to move the polarized magnet relative to the first and second magnetic sensors as the shifter lever is actuated.

14. The shifter device of claim 13 further comprising a connecting lever for mechanically connecting the shifter lever to the magnet support.

15. A multiple redundancy position sensor device for detecting a position of a shifter lever in a shifter device, the sensor device comprising:
a first magnetic sensor positioned on a first printed circuit board;
a second magnetic sensor being positioned on a second printed circuit board below the first magnetic sensor and the first printed circuit board, wherein the second magnetic sensor is a dual die magnetic sensor, wherein the first printed circuit board and the second printed circuit board extend horizontally along a first axis and are parallel to another, and wherein a first geometric axis extends through the first magnetic sensor and the second magnetic sensor and is perpendicular to the first axis; and
a polarized magnet arranged between the first magnetic sensor and the second magnetic sensor such that the polarized magnet is rotatable with at least one degree of freedom, wherein a signal based on an angular position of the polarized magnet relative to the first magnetic sensor and the second magnetic sensor corresponding to a shifter lever position is output to control a vehicle transmission.

16. The sensor device of claim 15, wherein the polarized magnet is arranged such that the polarized magnet is rotated around a second geometric axis.

17. The sensor device of claim 16, wherein the first geometric axis and the second geometric axis are coincident or parallel to each other.

18. The sensor device of claim 16, wherein the polarized magnet is configured to be rotatable with two degrees of freedom such that the second geometric axis is moveable relative to the first geometric axis.

19. A multiple redundancy position sensor device comprising:
a first magnetic sensor positioned on a first printed circuit board;
a second magnetic being a dual die magnetic sensor, with the first magnetic sensor and the second magnetic sensor defining a first geometric axis, wherein the second magnetic sensor is positioned on a second printed circuit board below the first magnetic sensor and the first printed circuit board, wherein the first print and the second printed circuit board extend horizontally along a first axis and are parallel to another, and wherein the first geometric axis extends through the first magnetic sensor and the second magnetic sensor is perpendicular to the first axis; and
a polarized magnet arranged between the first magnetic sensor and the second magnetic sensor, the polarized magnet being rotatable with at least one degree of freedom, wherein a signal based on an angular position of the polarized magnet relative to the first magnetic sensor and the second magnetic sensor corresponding to a shifter lever position is output to control a vehicle transmission.

20. The shifter device of claim 12, wherein the multiple redundancy position sensor device is vertically displaced from the shift lever.

* * * * *